(12) United States Patent
Lee

(10) Patent No.: US 9,048,455 B2
(45) Date of Patent: Jun. 2, 2015

(54) ENCAPSULATION MEMBER, ORGANIC LIGHT EMITTING DISPLAY DEVICE HAVING ENCAPSULATION MEMBER AND METHOD OF MANUFACTURING ORGANIC LIGHT EMITTING DISPLAY DEVICE HAVING ENCAPSULATION MEMBER

(71) Applicant: Samsung Display Co., Ltd., Yongin, Gyeonggi-Do (KR)

(72) Inventor: Hyun-Shik Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/962,869

(22) Filed: Aug. 8, 2013

(65) Prior Publication Data
US 2014/0077187 A1    Mar. 20, 2014

(30) Foreign Application Priority Data
Sep. 20, 2012  (KR) .......................... 10-2012-0104420

(51) Int. Cl.
| H01L 29/08 | (2006.01) |
| H01L 35/24 | (2006.01) |
| H01L 51/00 | (2006.01) |
| H01L 51/52 | (2006.01) |
| H01L 51/56 | (2006.01) |

(52) U.S. Cl.
CPC .......... *H01L 51/5256* (2013.01); *H01L 51/56* (2013.01); *Y10T 428/24851* (2015.01); *H01L 51/5281* (2013.01); *H01L 51/5284* (2013.01)

(58) Field of Classification Search
USPC ................................................ 257/40; 438/27
See application file for complete search history.

(56) References Cited

U.S. PATENT DOCUMENTS

| 8,866,383 | B2 * | 10/2014 | Jang et al. ..................... 313/512 |
| 2009/0004375 | A1 | 1/2009 | Kim et al. |
| 2012/0242222 | A1 * | 9/2012 | Jung et al. ..................... 313/512 |
| 2014/0183462 | A1 * | 7/2014 | Lee et al. .......................... 257/40 |

FOREIGN PATENT DOCUMENTS

| IO | 10-2009-0001371 A | 1/2009 |
| KR | 10-2008-0077530 A | 8/2008 |
| KR | 10-2010-0123977 A | 11/2010 |

* cited by examiner

*Primary Examiner* — Telly Green
(74) *Attorney, Agent, or Firm* — Knobbe Martens Olson & Bear, LLP

(57) ABSTRACT

An encapsulation member is disclosed. The encapsulation member includes at least two organic material layers, at least two inorganic material layers and a light absorption layer pattern. The inorganic material layers and the organic material layers are stacked alternately. The light absorption layer pattern is disposed between one of the organic material layers and one of the inorganic material layers which immediately neighbor each other. The light absorption layer pattern includes a plurality of wires which extend in a first direction, and are arranged substantially parallel to each other.

18 Claims, 8 Drawing Sheets

FIRST DIRECTION ⊗ → SECOND DIRECTION

FIRST DIRECTION ⊗ → SECOND DIRECTION

ENCAPSULATION MEMBER, ORGANIC LIGHT EMITTING DISPLAY DEVICE HAVING ENCAPSULATION MEMBER AND METHOD OF MANUFACTURING ORGANIC LIGHT EMITTING DISPLAY DEVICE HAVING ENCAPSULATION MEMBER

CROSS-REFERENCE TO RELATED APPLICATION(S)

This application claims priority under 35 USC §119 to Korean Patent Application No. 10-2012-0104420, filed on Sep. 20, 2012 in the Korean Intellectual Property Office (KIPO), the contents of which are incorporated herein in its entirety by reference.

BACKGROUND

1. Technical Field

The present disclosure relates to an encapsulation member, an organic light emitting display device having an encapsulation member, and a method of manufacturing an organic light emitting display device having an encapsulation member.

2. Discussion of Related Technology

Organic light emitting display (OLED) devices display information of images or characters by using light generated as holes and electrons, which are provided from an anode and a cathode, respectively, are combined with each other at an organic light emitting layer interposed between the anode and the cathode. The OLED devices have been spotlighted as next-generation display devices because the OLED devices have various advantages such as a wide viewing angle, a rapid response speed, a thin thickness, and low power consumption. The OLED devices may additionally include a polarization structure to prevent a reflection of an external light.

The organic light emitting layer of the OLED devices may be easily degraded by oxygen and/or moisture, so that the life span of the OLED devices may be reduced. Therefore, the OLED devices may include encapsulation members for protecting the organic light emitting layer from the external environment.

SUMMARY

Some example embodiments provide an encapsulation member having a polarizing characteristic.

Some example embodiments provide an organic light emitting display device including an encapsulation member having a polarizing characteristic.

Some example embodiments provide a method of manufacturing an organic light emitting display device including an encapsulation member having a polarizing characteristic.

Some example embodiments provide an encapsulation member including at least two organic material layers, at least two inorganic material layers and light absorption layer patterns. The inorganic material layers and the organic material layers are stacked alternately. The light absorption layer pattern is disposed between one of the organic material layers and one of the inorganic material layers which immediately neighbor each other. The light absorption layer pattern includes a plurality of wires which extend in a first direction, and are arranged substantially parallel to each other.

In some example embodiments, the light absorption layer pattern may include a polymer material and a light absorption material embedded in the polymer material.

In some example embodiments, the polymer material may include polyisoprene, polyacrylic acid, polybutadiene, polystyrene or polymethyl methacrylate.

In some example embodiments, the light absorption material may include a light absorption dye.

In some example embodiments, the inorganic material layers may include a first inorganic material layer, a second inorganic material layer and a third inorganic material layer. The organic material layers may include a first organic material layer between the first inorganic material layer and the second inorganic material layer, and a second organic material layer between the second inorganic material layer and the third inorganic material layer.

In some example embodiments, the light absorption layer pattern may be disposed between the first inorganic material layer and the first organic material layer, or between the second inorganic material layer and the second organic material layer.

In some example embodiments, the encapsulation member may further include another light absorption layer pattern. The light absorption layer pattern may be disposed between the first inorganic material layer and the first organic material layer. The other light absorption layer pattern may be disposed between the second inorganic material layer and the second organic material layer.

In some example embodiments, the organic material layers may further include a third organic material layer disposed on the third inorganic material layer. The inorganic material layers may further include a fourth inorganic material layer disposed on the third organic material layer.

Some example embodiments provide an organic light emitting display device including a substrate, a display structure and an encapsulation member. The display structure is disposed over the substrate. The encapsulation member is disposed over the substrate to encapsulate the display structure. The encapsulation member includes at least two organic material layers, at least two inorganic material layers and a light absorption layer pattern. The inorganic material layers and the organic material layers are stacked alternately. The light absorption layer pattern is disposed between one of the organic material layers and one of the inorganic material layers which immediately neighbor each other. The light absorption layer pattern comprising a plurality of wires which extend in a first direction, and are arranged substantially parallel to each other.

In some example embodiments, the light absorption layer pattern may include a polymer material and a light absorption material embedded in the polymer material.

In some example embodiments, the inorganic material layers may include a first inorganic material layer, a second inorganic material layer, a third inorganic material layer and a fourth inorganic material layer. The organic material layers may include a first organic material layer between the first inorganic material layer and the second inorganic material layer, a second organic material layer between the second inorganic material layer and the third inorganic material layer, and a third organic material layer between the third inorganic material layer and the fourth inorganic material layer.

In some example embodiments, the light absorption layer pattern may be disposed between the first inorganic material layer and the first organic material layer, between the second inorganic material layer and the second organic material layer, or between the third inorganic material layer and the third organic material layer.

In some example embodiments, the organic light emitting display device may further include a blocking wall formed over the substrate. The blocking wall may contact boundary portions of the organic material layers and the inorganic material layers.

In some example embodiments, the organic light emitting display device may further include a retardation layer between the display structure and the light absorption layer pattern.

Some example embodiments provide a method of manufacturing an organic light emitting display device. In the method, a display structure is formed over a substrate. An encapsulation member is formed over the substrate to encapsulate the display structure. The encapsulation member includes stacking of at least two inorganic material layers and at least two organic material layers which are alternately stacked. A light absorption layer pattern is formed between the organic material layers and the inorganic material layers. The light absorption layer pattern includes a plurality of wires which extend in a first direction, and are arranged substantially parallel to each other.

In some example embodiments, forming the light absorption layer pattern includes providing a donor structure including a plurality of wires, and by using a laser-induced thermal imaging process, transferring the plurality of wires onto the inorganic material layer to form the light absorption layer pattern.

In some example embodiments, providing the donor structure may include forming a light to heat conversion layer on a base substrate, forming a block copolymer layer on the light to heat conversion layer, annealing the block copolymer layer to form light absorption layer pattern and dummy portions, and removing the dummy portions.

In some example embodiments, the block copolymer layer may include at least two selected from the group consisting of polyisoprene, polyacrylic acid, polybutadiene, polystyrene and polymethyl methacrylate.

According to example embodiments, an encapsulation member may include at least two inorganic material layers, at least two organic material layers, and the light absorption layer pattern between the inorganic material layer and the organic material layer. The inorganic material layers may effectively encapsulate a space (not illustrated) between a substrate and the encapsulation member from moisture and oxygen, and the light absorption layer pattern may serve as a wire grid type polarizer. Therefore, the encapsulation member may have a relatively small thickness and a relatively large flexibility compared with a structure in which an encapsulation member and a polarizer are assembled as separate pieces.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EMBODIMENTS

Figure 1:
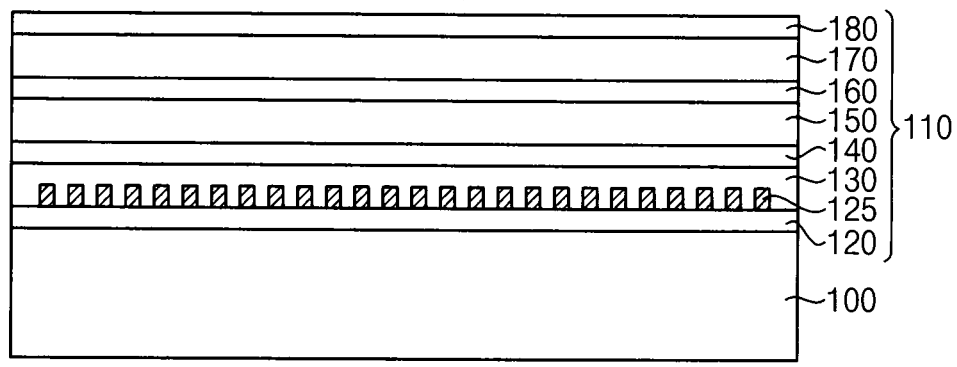
FIG. 1 is a cross sectional view illustrating an encapsulation member in accordance with example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross sectional view illustrating an encapsulation member in accordance with example embodiments.

Referring to FIG. 1, an encapsulation member 110 may be disposed on a substrate 100. The substrate 100 may include a transparent substrate. For example, the substrate 100 may include a glass substrate, a transparent plastic substrate, etc. Further, the substrate 100 may include a flexible substrate.

In example embodiments, the encapsulation member 110 may include at least two inorganic material layers and at least two organic material layers which may be stacked alternately and repeatedly. The encapsulation member 110 may further include a light absorption pattern 125 disposed between the inorganic material layers and the organic material layers.

In example embodiments, the inorganic material layers may include a first inorganic material layer 120, a second inorganic material layer 140, a third inorganic material layer 160 and a fourth inorganic material layer 180. While the organic material layers may include a first organic material layer 130 between the first inorganic material layer 120 and the second inorganic material layer 140, a second organic material layer 150 between the second inorganic material layer 140 and the third inorganic material layer 160, and a third organic material layer 170 between the third inorganic material layer 160 and the fourth inorganic material layer 180. That is, the plurality of the inorganic material layers 120, 140, 160 and 180 and the plurality of the organic material layers 130, 150 and 170 may be stacked alternately and repeatedly.

The first inorganic material layer 120 may be disposed over the substrate 100. The first inorganic material layer 120 may encapsulate a space (not illustrated) between the substrate 100 and the first inorganic material layer 120 to prevent oxygen and moisture penetration form outside into the space. For example, the first inorganic material layer 120 may include aluminum oxide (AlOx), titanium oxide (TiOx), magnesium oxide (MgOx), tin oxide (SnOx), zinc oxide (ZnOx), copper oxide (CuOx) or silicon oxide (SiOx).

The light absorption layer pattern 125 may be disposed on the first inorganic material layer 120. In example embodiments, the light absorption layer pattern 125 may include a plurality of wires, for example, nano-wires. The plurality of wires may be arranged in a second direction, and each of the wires (which can be also referred as rods or bars) may extend in a first direction which is substantially perpendicular to the second direction. The light absorption layer pattern 125 may include a polymer material and a light absorption material embedded in the polymer material. For example, the polymer material may include polyisoprene, polyacrylic acid, polybutadiene, polystyrene or polymethyl methacrylate (PMMA), which may include a self-assembled block copolymer. The light absorption material may include a light absorption dye such as iodine. The light absorption material may be degraded by oxygen or moisture.

The light absorption layer pattern 125 may absorb a first light component of an incident light which vibrates in the first direction. On the other hand, the light absorption layer pattern 125 may allow a second light component of the incident light, which vibrates in the second direction, to pass therethrough. The light absorption layer pattern 125 may serve as a wire grid type polarizer which may allow a specific polarized light component of the incident light to pass therethrough.

The first organic material layer 130 may be disposed on the first inorganic material layer 120 to substantially cover the light absorption layer pattern 125. For example, the first organic material layer 130 may include an organic material, e.g., an epoxy resin, an acrylate resin, a urethane acrylate resin, etc. The first organic material layer 130 may relieve an internal stress in the first and second inorganic material layers 120 and 140, or may fill a micro crack and/or a pin hole in the first and second inorganic material layers 120 and 140 to prevent moisture and oxygen penetration.

The second inorganic material layer 140, the third inorganic material layer 160 and the fourth inorganic material layer 180 may be sequentially stacked on the first inorganic material layer, and each of the inorganic material layers 140, 160 and 180 may be spaced apart from each other. The second inorganic material layer 140, the third inorganic material layer 160 and the fourth inorganic material layer 180 may include a material substantially the same as or substantially similar to that of the first inorganic material layer 120, and may perform a function substantially the same as or substantially similar to that of the first inorganic material layer 120. For example, the second to the fourth inorganic material layers 140, 160 and 180 may repeatedly encapsulate a space between the substrate 100 and the second to the fourth inorganic material layers 140, 160 and 180, thereby preventing moisture and oxygen penetration from outside into the space. Further, the second to the fourth inorganic material layers 140, 160 and 180 may prevent moisture and oxygen penetration from outside into the light absorption layer pattern 125, so that the light absorption layer pattern 125 may not be degraded or oxidized.

The second organic material layer 150 and the third organic material layer 170 may be stacked alternately and repeatedly with the second to the fourth inorganic material layers 140, 160 and 180. The second and the third organic material layers 150, 170 may include a material substantially the same as or substantially similar to that of the first organic material layer 130, and may perform a function substantially the same as or substantially similar to that of the first organic material layer 130. For example, the second and the third organic material layers 150 and 170 may relieve an internal stress in the second to the fourth inorganic material layers 140, 160 and 180, so that flexibility of the encapsulation member 110 may increase.

In example embodiments, as illustrated in FIG. 1, each of the first to the fourth inorganic material layers 120, 140, 160 and 180 may have substantially the same thickness, and each of the first to the third organic material layers 130, 150 and 170 may have substantially the same thickness. Alternatively, the first to the fourth inorganic material layers 120, 140, 160 and 180 may have thicknesses different from one another, and the first to the third organic material layers 130, 150 and 170 may have thicknesses different from one another.

Although, the encapsulation member 110 may be depicted to include the three organic material layers 130, 150 and 170 and the four inorganic material layers 120, 140, 160 and 180 in FIG. 1, however, the invention may not be limited to the illustration. For example, the encapsulation member 110 may include two organic material layers and three inorganic material layers, or may include four organic material layers and five inorganic material layers.

According to example embodiments, the encapsulation member 110 may include at least two inorganic material layers 120, 140, 160 and 180, at least two organic material layers 130, 150 and 170, and the light absorption layer pattern 125 between the inorganic material layer and the organic material layer. The first to the fourth inorganic material layers 120, 140, 160 and 180 may effectively encapsulate the space (not illustrate) between the substrate 100 and the encapsulation member 110 from moisture and oxygen, and the light absorption layer pattern 125 may serve as the wire grid type polarizer to transform a polarization state of the incident light. Further, the light absorption layer pattern 125 may be disposed in the encapsulation member 110, and an additional encapsulation member for preventing degradation of the light absorption layer pattern 125 may be omitted. Therefore, the encapsulation member 110 may have a thickness smaller than that of an assembled structure of an encapsulation member and a polarizer prepared as separate pieces. The encapsulation member 110 may have flexibility greater than such assembled structure.

Figure 2:
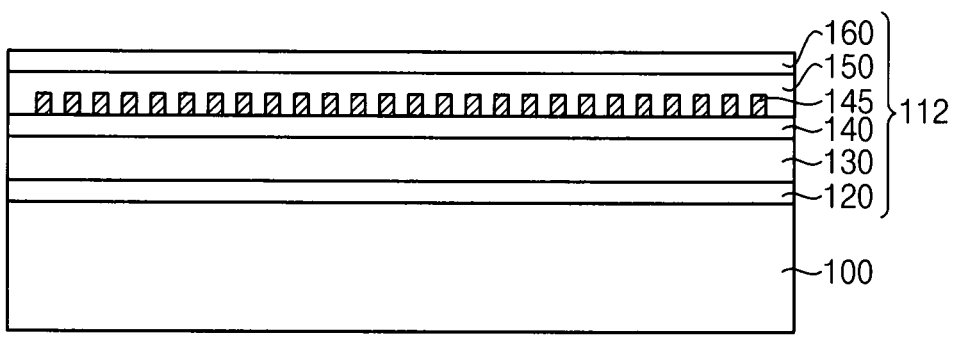
FIG. 2 is a cross sectional view illustrating an encapsulation member in accordance with some example embodiments.

FIG. 2 is a cross sectional view illustrating an encapsulation member in accordance with some example embodiments.

Referring to FIG. 2, an encapsulation member 112 may be disposed on a substrate 100. The encapsulation member 112 illustrated in FIG. 2 may be substantially the same as or substantially similar to those described with reference to FIG. 1 except for numbers of the organic and inorganic material layers and a position of light absorption layer pattern 145.

The encapsulation member 112 may include at least two inorganic material layers and at least two organic material layers which may be stacked alternately and repeatedly. In example embodiments, the inorganic material layers may include a first inorganic material layer 120, a second inorganic material layer 140 and a third inorganic material layer 160, and the organic material layers may include a first organic material layer 130 between the first inorganic material layer 120 and the second inorganic material layer 140 and a second organic material layer 150 between the second inorganic material layer 140 and the third inorganic material layer 160.

The light absorption layer pattern 145 may be disposed on the second inorganic material layer 140. The light absorption layer pattern 145 may include a material substantially the same as or similar to that of the light absorption layer pattern 125 described with reference to FIG. 1.

According to example embodiments, the encapsulation member 112 may include at least two inorganic material layers 120, 140 and 160, at least two organic material layers 130 and 150, and the light absorption layer pattern 145 between the inorganic material layer and the organic material layer. The first to the third inorganic material layers 120, 140 and 160 may effectively encapsulate a space (not illustrated) between the substrate 100 and the encapsulation member 112 from moisture and oxygen, and the light absorption layer pattern 145 may serve as a wire grid type polarizer. Therefore, the encapsulation member 112 may have a thickness smaller than that of an assembled structure of an encapsulation member and a polarizer prepared as separate pieces. The encapsulation member 112 may have flexibility greater than such assembled structure.

Figure 3:
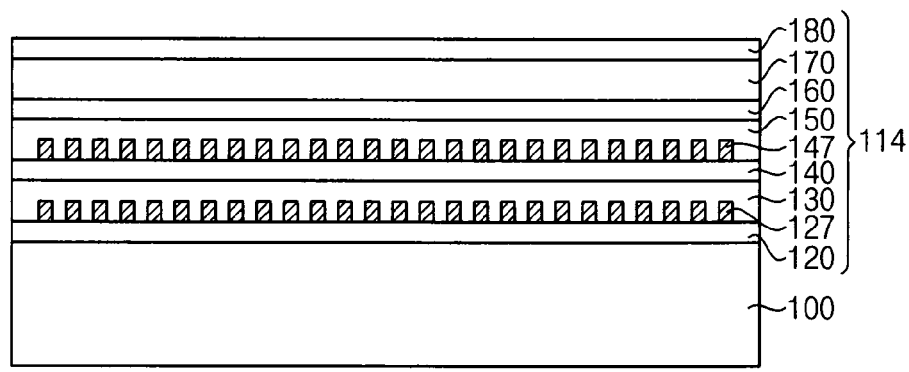
FIG. 3 is a cross sectional view illustrating an encapsulation member in accordance with some example embodiments.

FIG. 3 is a cross sectional view illustrating an encapsulation member in accordance with some example embodiments.

Referring to FIG. 3, an encapsulation member 114 may be substantially the same as or substantially similar to those described with reference to FIG. 1 except for light absorption layer patterns 127 and 147.

The encapsulation member 114 disposed on a substrate 100 may include at least two inorganic material layers, at least two organic material layers which may be stacked alternately and repeatedly. In example embodiments, the inorganic material layers may include a first inorganic material layer 120, a second inorganic material layer 140, a third inorganic material layer 160 and a fourth inorganic material layer 180, and the organic material layers may include a first organic material layer 130 between the first inorganic material layer 120 and the second inorganic material layer 140, a second organic material layer 150 between the second inorganic material layer 140 and the third inorganic material layer 160, and a third organic material layer 170 between the third inorganic material layer 160 and the fourth inorganic material layer 180.

The encapsulation member 114 may further include a first light absorption layer pattern 127 and a second light absorption layer pattern 147. In example embodiments, the first light absorption layer pattern 127 and the second light absorption layer pattern 147 may be disposed on the first inorganic material layer 120 and the second inorganic material layer 140, respectively. The first light absorption layer pattern 127 and the second light absorption layer pattern 147 may be arranged parallel to each other. Each of the first light absorption layer pattern 127 and the second light absorption layer pattern 147 may include a plurality of wires. The plurality of wires may be arranged in a second direction, and each of the wires may extend in a first direction which is substantially perpendicular to the second direction.

According to example embodiments, the encapsulation member 114 may include at least two inorganic material layers 120, 140, 160 and 180, at least two organic material layers 130, 150 and 170, the first light absorption layer pattern 127 and the second light absorption layer pattern 147. The first light absorption layer pattern 127 and the second light absorption layer pattern 147 may serve as a wire grid type polarizer. The first light absorption layer pattern 127 and the second light absorption layer pattern 147 may be disposed as a multi layer, so that polarization characteristic of the encapsulation member 114 may be improved.

Figure 4:
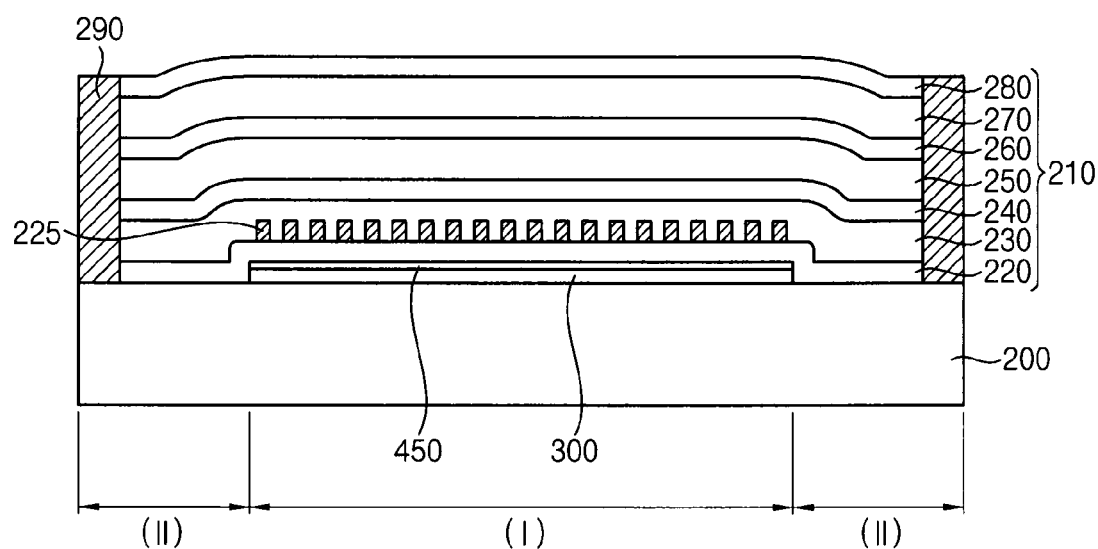
FIG. 4 is a cross sectional view illustrating an organic light emitting display device in accordance with example embodiments.
Figure 5:
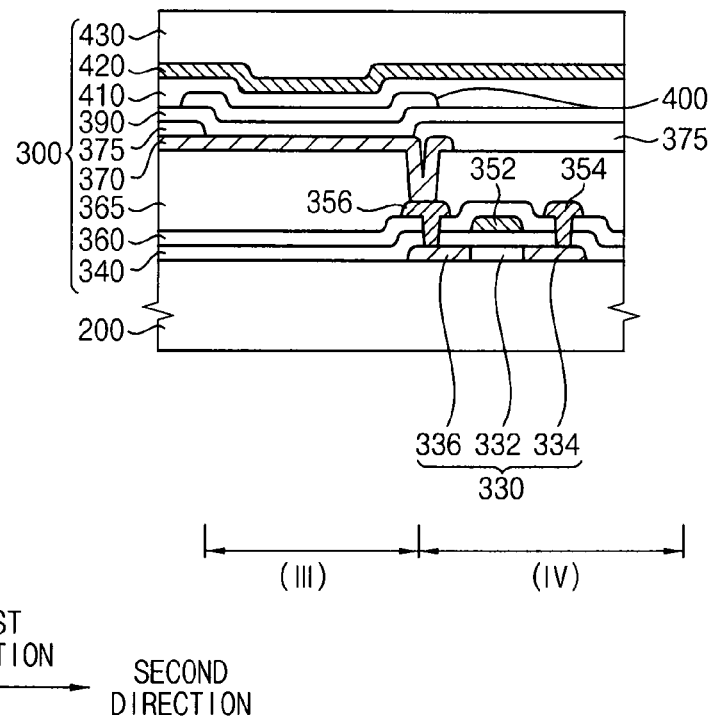
FIG. 5 is a cross sectional view illustrating a display structure and a substrate in accordance with example embodiments.

FIG. 4 is a cross sectional view illustrating an organic light emitting display device in accordance with example embodiments, and FIG. 5 is a cross sectional view illustrating a display structure and a substrate in accordance with example embodiments.

Referring to FIG. 4, the organic light emitting display device may include a substrate 200, a display structure 300 and an encapsulation member 210 for surrounding the display structure 300.

The substrate 200 may include a transparent substrate. For example, the substrate 200 may include a glass substrate, a transparent plastic substrate, etc. Further, the substrate 200 may include a flexible substrate. The substrate 200 may include a first region I and a second region II surrounding the first region I.

The display structure 300 may be disposed on the substrate 200 in the first region I. The constitution of the display structure 300 will be described with reference to FIG. 5.

A retardation layer 450 may be disposed on the display structure 300. For example, the retardation layer 450 may include a birefringent film containing a polymer such as polystyrene, polycarbonate, polyvinylalcohol, polypropylene, polymethylmethacrylate, polyolefine, polyarylate, polyamide, cyclo-olefin polymer, cyclo-olefin copolymer, etc., an alignment film of liquid crystal polymer and/or an alignment layer containing liquid crystal polymer.

The retardation layer 450 may ensure a phase difference between two polarization components of light incident thereto. The retardation layer 450 may cause a predetermined phase difference between two polarization components which are substantially perpendicular to each other. For example, the predetermined phase difference corresponds to a quarter wavelength of the incident light.

The encapsulation member 210 may be disposed over the substrate 200 to encapsulate the display structure 300 and the retardation layer 450. The encapsulation member 210 may be substantially the same as or substantially similar to the encapsulation member 110 described with reference to FIG. 1 except for an end portion in the second region II. For example, the encapsulation member 210 may include at least two inorganic material layers 220, 240, 260 and 280, at least two organic material layers 230, 250 and 270, and light absorption layer pattern 225.

A blocking pattern or blocking wall 290 may be disposed to contact boundary portions or edges of the encapsulation member 210. The blocking pattern or seal 290 may be disposed on or over the substrate 200 to surround the encapsulation member 210. For example, when the display structure 300 and the encapsulation member 210 have a rectangular planar shape, the blocking pattern 290 may form a closed loop to surround the rectangular shape. In one example embodiment, the blocking pattern may have a height substantially the same as or higher than that of the encapsulation member 210. For example, the blocking pattern 290 may include organic material, e.g., an epoxy resin, an acrylate resin, a urethane acrylate resin, a polyimide (PI) resin, etc.

The blocking pattern or wall 290 may surround the end portion of the encapsulation member 210, so that the blocking pattern 290 may prevent oxygen and moisture penetration in a direction parallel to the upper surface of the substrate 200 at the end portion of the encapsulation member 210.

Although, the organic light emitting display device may be depicted to include the encapsulation member 210 substantially the same as or substantially similar to the encapsulation member 110 described with reference to FIG. 1, however, the invention may not be limited to the illustration. For example, the organic light emitting display device may include an encapsulation member substantially the same as or substantially similar to that described with reference to FIG. 2 or 3.

Referring to FIG. 5, the display structure 300 may include a switching structure, a first electrode 370, a light emitting structure and a second electrode 420 on the substrate 200. Although the organic light emitting display device illustrated in FIG. 5 may have a bottom emission type, the organic light emitting display device may have a top emission type in accordance with materials included in the first and the second electrodes 370 and 420.

The switching structure may be disposed on the substrate 200, and the first electrode 370 may be disposed on the switching structure to be electrically connected to the switching structure. The light emitting structure may be disposed between the first electrode 370 and the second electrode 420.

When the organic light emitting display device has an active matrix type, the switching structure may be formed on the substrate 200. In some example embodiments, the switching structure may include a switching device, at least one insulation layer, a contact, a pad, a plug, etc. Here, the switching device may include a thin film transistor (TFT), an oxide semiconductor device, etc.

When the switching device in the switching structure includes the thin film transistor, the switching device may include a semiconductor layer 330, a gate electrode 352, a source electrode 354, a drain electrode 356, etc. In some example embodiments, the semiconductor layer 330 may include silicon. Alternatively, the semiconductor layer 330 may include oxide semiconductor, e.g., In—Ga—Zn-oxide.

In some example embodiments, the semiconductor layer 330 may be disposed on the substrate 200, and the semiconductor layer 330 may be divided into a source region 334, a drain region 336 and a channel region 332 through an ion implantation process. Then, a gate insulation layer 340 may be disposed to electrically isolate the semiconductor layer 330.

A gate electrode 352 may be disposed on the gate insulation layer 340, and then a first insulation layer 360 may be disposed on the gate insulation layer 340 and the gate electrode 352.

The source electrode 354 and the drain electrode 356 may be disposed through the gate insulation layer 340 and the first insulation layer 360 to contact the source and the drain regions 334 and 336, respectively. A gate signal may be applied to the gate electrode 352 and a data signal may be applied to the source electrode 354.

In the organic light emitting display device illustrated in FIG. 5, the switching device including the thin film transistor may have a top gate configuration in which the gate electrode 352 may be disposed over the semiconductor layer 330, however, the configuration of the switching device may not be limited thereto. For example, the switching device may have a bottom gate configuration in which a gate electrode may be disposed under the semiconductor layer.

A second insulation layer 365 may be disposed on the first insulation layer 360 to substantially cover the source electrode 354 and the drain electrode 356. In some example embodiments, the second insulation layer 365 may have a substantially flat surface obtained by a planarization process, for example, a chemical mechanical polishing (CMP) process, an etch-back process, etc.

The first electrode 370 may be formed on the switching structure, and a pixel defining layer 375 may be formed in a region on the switching structure where the first electrode 370 is not positioned.

Referring to FIG. 5, the light emitting structure may be obtained by forming a hole transfer layer 390, by forming an organic light emitting layer 400, by forming an electron transfer layer 410, etc. The organic light emitting layer 400 may be formed using an organic material or a mixture of an organic material and an inorganic material for generating a red color of light (or red light), a green color of light (or green light) and/or a blue color of light (or blue light). The organic light emitting layer 400 may have a stacked structure that includes a plurality of light emitting films for generating the red color of light, the green color of light and the blue color of light to thereby provide a white color of light.

In some example embodiments, the organic light emitting layer 400 is formed in a display region III, and the pixel defining layer 375 is formed in a peripheral region IV. Therefore, light generated from the organic light emitting layer 400 may be emitted in the display region III whereas the light may not be emitted in the peripheral region IV.

In some example embodiments, the first electrode 370 serves as an anode for providing holes into the hole transfer layer 390 of the light emitting structure, and the second electrode 420 serves as a cathode for supplying electrons into the electron transfer layer 410. Depending on an emission type of the OLED display, the first electrode 370 may be a transparent electrode or a semi-transparent electrode, and the second electrode 420 may be a reflective electrode. For example, the first electrode 370 may be formed using a transparent conductive material including at least one of the following: indium tin oxide (ITO), zinc tin oxide (ZTO), indium zinc oxide (IZO), zinc oxide (ZnOx), tin oxide (SnOx), gallium oxide (GaOx), etc. The second electrode 420 may be formed using a reflective material such as aluminum (Al), tungsten (W), copper (Cu), nickel (Ni), chromium (Cr), molybdenum (Mo), titanium (Ti), platinum (Pt), silver (Ag), tantalum (Ta), ruthenium (Ru), alloys thereof and nitrides thereof.

The capping layer 430 may be disposed on the second electrode 420 to cover the light emitting structure. For example, the capping layer 430 may include a polymer material.

When, the organic light emitting layer 400 emits the white color of light, a color filter layer (not illustrated) may be further disposed to convert an incident light into the red color of light, the green color of light or the blue color of light. The color filter layer may include a red color pattern, a green color pattern and a blue color pattern which may be arranged regularly. That is, the organic light emitting display device may be a white OLED which may include the organic light emitting layer 400 emitting the white color of light and the color filter layer.

According to example embodiments, the organic light emitting display device may include the encapsulation member 210 to encapsulate the display structure 300 on the substrate 200, and the encapsulation member 210 may include at least two inorganic material layers 220, 240, 260 and 280, at least two organic material layers 230, 250 and 270, and the light absorption layer pattern 225. The encapsulation member 210 may effectively prevent moisture and oxygen penetration from outside into the display structure 300. The light absorption layer pattern 225 may serve as the wire grid type polarizer to transform the polarization state of the incident light, so that the light absorption layer pattern 225 and the retardation layer 450 may prevent or reduce a reflection of an external light.

Figure 6:
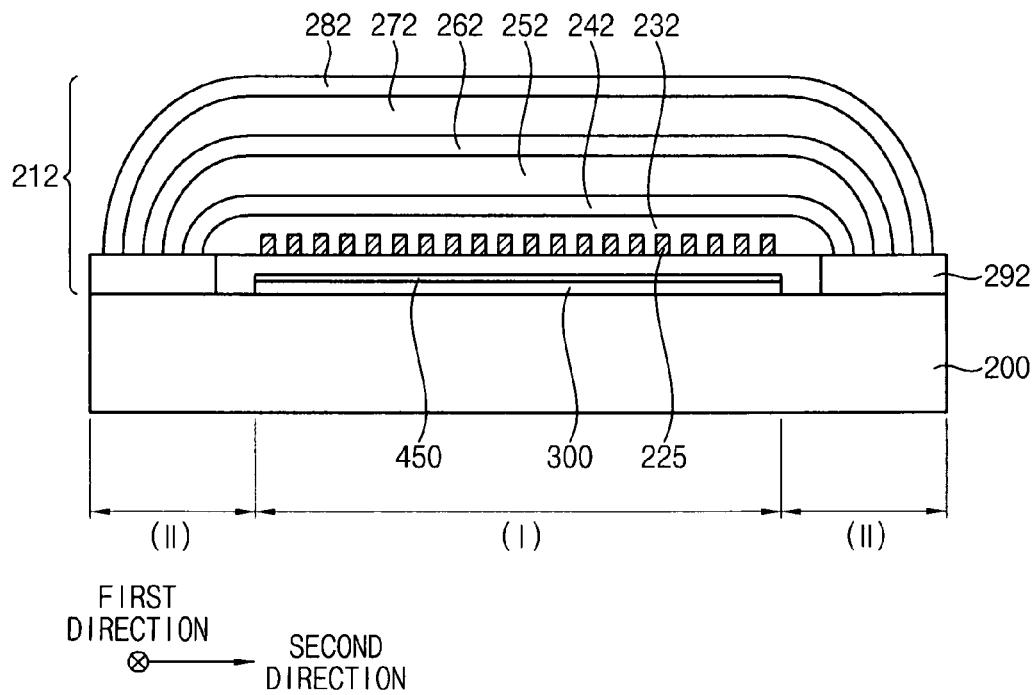
FIG. 6 is a cross sectional view illustrating an organic light emitting display device in accordance with some example embodiments.

FIG. 6 is a cross sectional view illustrating an organic light emitting display device in accordance with some example embodiments. The organic light emitting display device illustrated in FIG. 6 may be substantially the same as or substantially similar to those described with reference to FIG. 4 except for an end portion of an encapsulation member 212.

Referring to FIG. 6, the organic light emitting display device may include a substrate 200, a display structure 300, and the encapsulation member 212 surrounding the display structure 300.

The encapsulation member 212 may be substantially the same as or substantially similar to those described with reference to FIG. 1 except for an end portion in the second region II of the substrate 200. For example, the encapsulation member 212 may include a light absorption layer pattern 225, at least two inorganic material layers and at least two organic material layers which may be stacked alternately and repeatedly.

A blocking pattern or seal 292 may be disposed on the substrate 200 in the second region II, and may be spaced apart from the display structure 300. For example, when the display structure 300 and the encapsulation member 212 have a rectangular planar shape, the blocking pattern 292 may form a closed loop to surround the rectangular shape.

In example embodiment the blocking pattern 292 may include an inorganic material, e.g., AlOx, TiOx, MgOx, SnOx, ZnOx, CuOx or SiOx.

The encapsulation member 212 may have an end portion directly contacting the blocking pattern 292. That is, the plurality of inorganic material layers 242, 262 and 282 and the plurality of organic material layers 232, 252, 272 may have bent end portions directly contacting an upper face of the blocking pattern 292. Therefore, blocking pattern 292 may prevent moisture and oxygen penetration at the end portion of the encapsulation member 212.

According to example embodiments, the organic light emitting display device may include the encapsulation member 212 to encapsulate the display structure 300 on the substrate 200, and the encapsulation member 212 may include a plurality of inorganic material layers, a plurality of organic material layers, and the light absorption layer pattern 225. The encapsulation member 212 may effectively prevent moisture and oxygen penetration. The light absorption layer pattern 225 may serve as a wire grid type polarizer to transform polarization state of the incident light, so that the light absorption layer pattern 225 and the retardation layer 450 may prevent or reduce a reflection of an external light.

Figure 7:
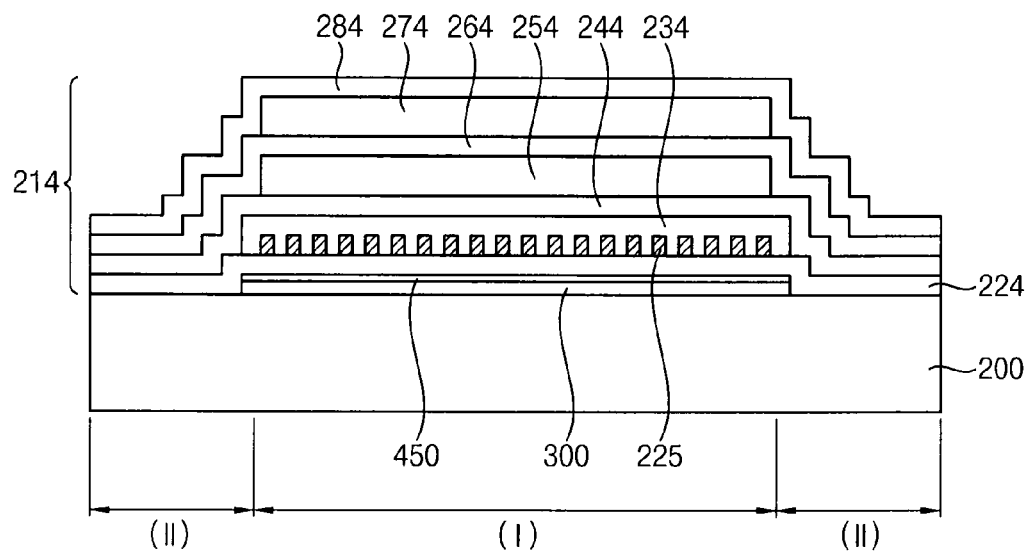
FIG. 7 is a cross sectional view illustrating an organic light emitting display device in accordance with some example embodiments.

FIG. 7 is a cross sectional view illustrating an organic light emitting display device in accordance with some example embodiments. The organic light emitting display device illustrated in FIG. 7 may be substantially the same as or substantially similar to those described with reference to FIG. 4 except for an end portion of an encapsulation member 214.

Referring to FIG. 7, the organic light emitting display device may include a substrate 200, a display structure 300, and the encapsulation member 214 surrounding the display structure 300.

The encapsulation member 214 may be substantially the same as or substantially similar to those described with reference to FIG. 1 except for the end portion in the second region II of the substrate 200. For example, the encapsulation member 214 may include a light absorption layer pattern 225, at least two inorganic material layers and at least two organic material layers which may be stacked alternately and repeatedly. The inorganic material layers may include first to fourth inorganic material layers 224, 244, 264 and 284, and the organic material layers may include first to third organic material layers 234, 254 and 274.

In example embodiments, the first to the third organic material layers 234, 254 and 274 may have widths different from one another. For example, the first organic material layer 234, the second organic material layer 254 and the third organic material layer 274 may have reduced widths sequentially, and may be disposed in the first region I. On the other hand, each of the first to fourth inorganic material layers 224, 244, 264 and 284 may have substantially the same width, and may be disposed in the first region I and the second region II. Therefore, the first to fourth inorganic material layers 224, 244, 264 and 284 may directly contact one another in the second region II. Accordingly, the first to fourth inorganic material layers 224, 244, 264 and 284 may effectively prevent moisture and oxygen penetration at the end portion of the encapsulation member 214.

According to example embodiments, the organic light emitting display device may include the encapsulation member 214 to encapsulate the display structure 300 on the substrate 200, and the encapsulation member 214 may include a plurality of inorganic material layers, a plurality of organic material layers, and the light absorption layer pattern 225. The encapsulation member 214 may effectively prevent moisture and oxygen penetration. The light absorption layer pattern 225 may serve as a wire grid type polarizer to transform polarization state of the incident light, so that the light absorption layer pattern 225 and the retardation layer 450 may prevent or reduce a reflection of an external light.

FIGS. 8 to 18 are cross sectional views illustrating a method of manufacturing an organic light emitting display device in accordance with example embodiments.

Figure 8:
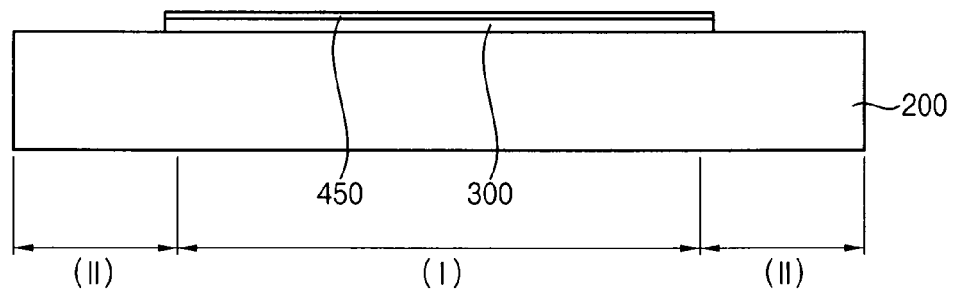
FIGS. 8 to 18 are cross sectional views illustrating a method of manufacturing an organic light emitting display device in accordance with example embodiments.

Referring to FIG. 8, a retardation layer 450 may be formed on a substrate 200 having a display structure 300.

The substrate 200 may include a transparent substrate. For example, the substrate 200 may include a glass substrate, a transparent plastic substrate, etc. Further, the substrate 200 may include a flexible substrate. The substrate 200 may include a first region I and a second region II surrounding the first region I.

The display structure 300 may be disposed on the substrate 200. The display structure 300 may be substantially the same as that described with reference to FIG. 5.

The retardation layer 450 may be formed on the display structure 300. The retardation layer 450 may be formed using a birefringent film, alignment film of liquid crystal polymer, etc. For example, the retardation layer 450 may be formed by melting a cycloolefin polymer, extruding the cycloolefin polymer into a film having a predetermined width and a predetermined thickness, and then cutting the film to have a size corresponding to that of the display structure 300.

Figure 9:
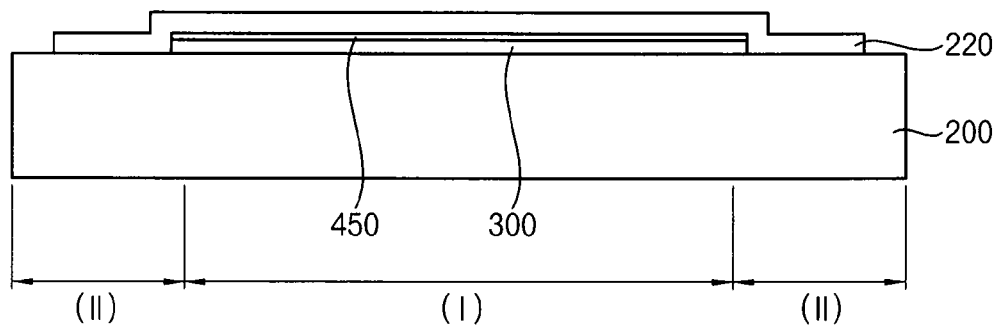

Referring to FIG. 9, a first inorganic layer 220 may be formed on the substrate 200 to cover the display structure 300 and the retardation layer 450. In example embodiments, the first inorganic material layer 220 may be formed using AlOx or SiOx by a chemical vapor deposition (CVD) process, a sputtering process, an atomic layer deposition (ALD) process, or a Plasma Enhanced CVD (PECVD) process. The first inorganic material layer 220 may encapsulate the display structure 300 and the retardation layer 450 to prevent oxygen and moisture penetration into the display structure 300.

Figure 10:
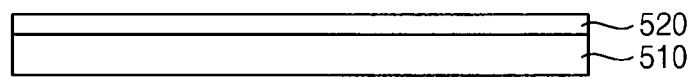

Referring to FIG. 10, a light to heat conversion layer 520 may be formed on a base substrate 510.

The base substrate 510 may include a material that may have a predetermined mechanical strength and a predetermined flexibility. For example, the base substrate 510 may include a transparent polymer such as polyethylene terephthalate, polyester, polyacryl, polyepoxy, polyethylene, polystyrene, etc. The base substrate 510 may serve to support elements of the donor structure or transfer structure 500 (see FIG. 13).

The light to heat conversion layer 520 may be formed on the base substrate 510.

The light to heat conversion layer 520 may include a light absorbing material that may convert a laser beam irradiated from a laser irradiation apparatus to a thermal energy. In example embodiments, the light to heat conversion layer 520 may be formed using a metal-containing layer including aluminum (Al), molybdenum (Mo), oxide thereof and/or sulfide thereof by a CVD process, a PECVD process, an ALD process, a sputtering process, a PVD process, etc. In some example embodiments, the light to heat conversion layer 120 may be formed using an organic-containing layer including polymers having carbon black, graphite and/or infra-red dye by a spin coating process, a printing process, a CVD process, etc.

In some example embodiments, a buffer layer (not illustrated) may be further formed on the light to heat conversion layer 520 to prevent or reduce thermal damage generated from the light to heat conversion layer 520.

Figure 11:
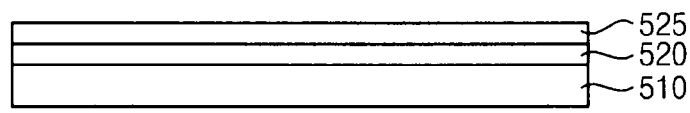

Referring to FIG. 11, a block copolymer layer 525 may be formed on the light to heat conversion layer 520.

In some example embodiments, the block copolymer layer 525 may be coated on the light to heat conversion layer 520 using a block copolymer solution. The block copolymer solution may include at least two selected from the group consisting of polyisoprene, polyacrylic acid, polybutadiene, polystyrene and polymethyl methacrylate. For example, the block copolymer solution may include polystyrene, polymethyl methacrylate and toluene. Toluene may be a solvent of polystyrene and polymethyl methacrylate. In this case, a weight ratio of polystyrene and polymethyl methacrylate may be about 4:6 to about 6:4.

Figure 12:
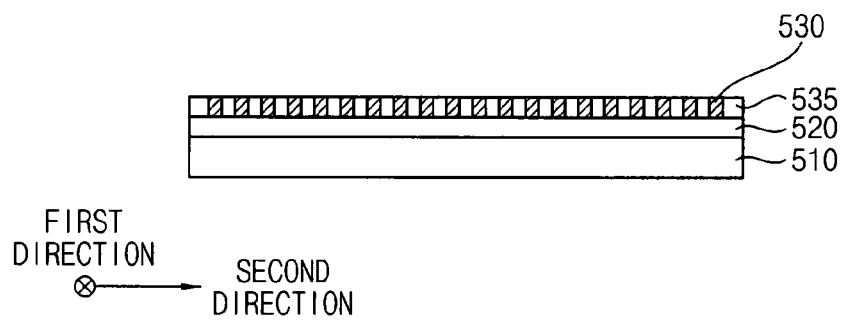

Referring to FIG. 12, a light absorption layer pattern 530 of wires and a dummy pattern 535 of dummy portions to be removed may be formed on the light to heat conversion layer 520. In embodiments, the wires and the dummy portions are alternately arranged.

By annealing the block copolymer layer 525, the light absorption layer pattern 530 and the dummy pattern 535 may be formed. For example, the annealing process may be performed at a temperature of about 250° C. for about 2 to 10 minutes. Therefore, the polymers in the block copolymer layer 525 may be converted into the light absorption layer pattern 530 and the dummy pattern 535 having a periodic lamellae structure.

Figure 13:
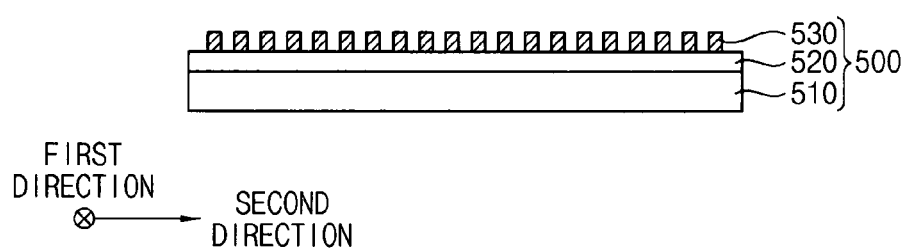

Referring to FIG. 13, the dummy pattern 535 may be removed to form a donor structure 500.

The dummy pattern 535 may be removed by using a selective etching solution. Therefore, the light absorption layer pattern 530 may be formed on the light to heat conversion layer 520 to have a plurality of wires. The plurality of wires may be arranged in a second direction substantially perpendicular to the first direction, and each of the wires may extend in the first direction.

Figure 14:
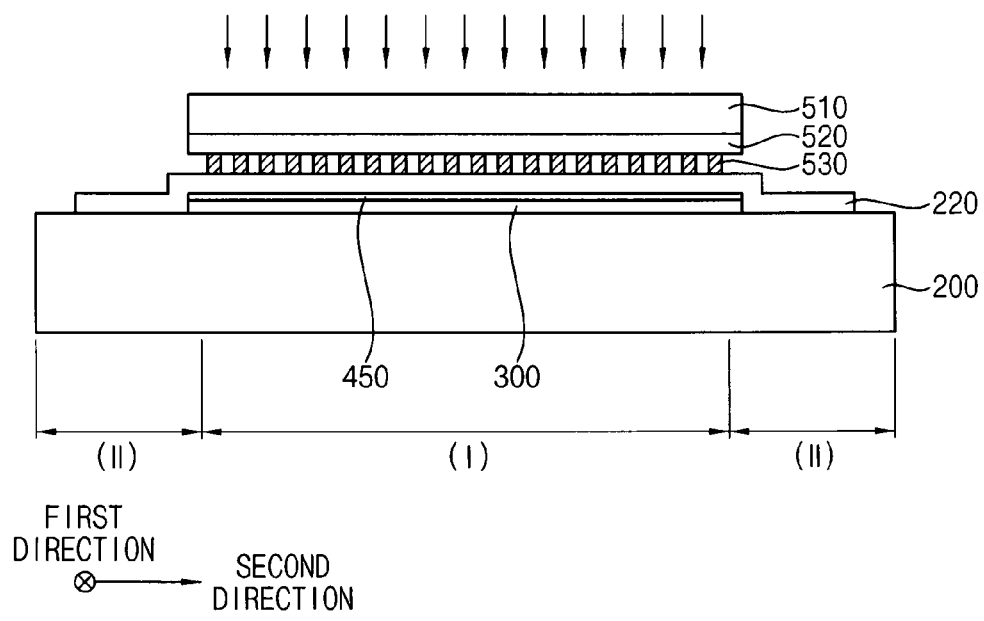

Referring to FIG. 14, the donor structure 500 may be placed on the first inorganic material layer 220 such that the wires are disposed between the first inorganic material layer 220 and the base substrate 510, and then a laser beam may be irradiated to the donor structure 500.

In example embodiments, after mounting the substrate 200 on a supporting apparatus (not illustrated), the substrate 200 may be aligned with the donor structure 500. Then, a pressurizing member (not illustrated) may pressurize the donor structure 500 to laminate the donor structure 500 including the light absorption layer pattern 530 on the first inorganic material layer 220 of the substrate 200. In example embodiments, the pressurizing member may include a roller, crown press, etc. In some example embodiments, the donor structure 500 may be pressurized using gases without using the pressurizing member, so that the donor structure 500 may be adhered to the substrate 200.

Then, the laser beam as indicated using arrows may be irradiated on a portion of the donor structure 500 that may be overlapped with the display structure 300. In the region where the laser beam is irradiated, an adhesive strength between the light absorption layer pattern 530 and the first inorganic material layer 220 of the substrate 200 may be larger than that between the light to heat conversion layer 520 and the light absorption layer pattern 530. Therefore, a portion of the light absorption layer pattern 530 where the laser beam is irradiated may be removed from the light to heat conversion layer 520.

Figure 15:
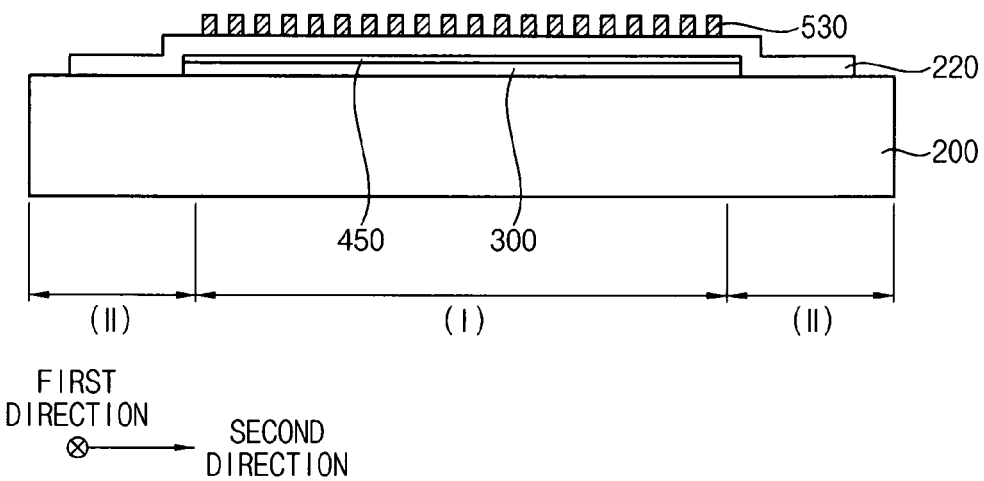

Referring to FIG. 15, the base substrate 510 and the layer 520 of the donor structure 500 may be removed, and then the light absorption layer pattern 530 may be formed on the first inorganic material layer 220 of the substrate 200.

As described above, the light absorption layer pattern 530 may be formed on the substrate 200, and then the donor structure 500 may be removed from the substrate 200. In this case, inert gases such as nitrogen gas and argon gas from the nozzles may be sprayed between the substrate 200 and the donor structure 500 to facilitate the separation of the donor structure 500.

According to example embodiments, the light absorption layer pattern 530 formed from the block copolymer layer 525 may be transferred onto the first inorganic material layer 220 by a laser-induced thermal imaging process. Therefore, a thermal damage and moisture, which may be generated during a process for forming the light absorption layer pattern 530, may not damage the display structure 300 on the substrate 200.

Figure 16:
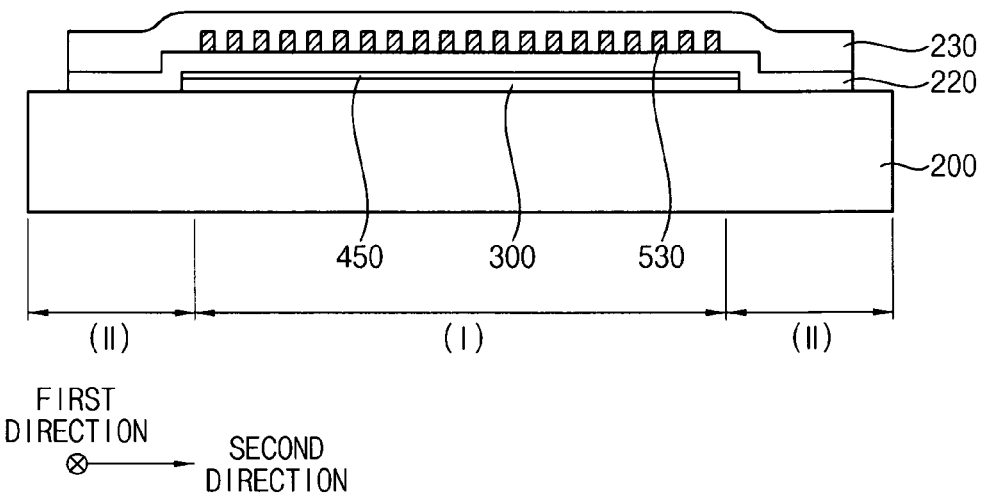

Referring to FIG. 16, a first organic material layer 230 may be formed on the first inorganic material layer 220 to cover the light absorption layer pattern 530.

In example embodiments, the first organic material layer 230 may be formed using an organic material, e.g., an epoxy resin, an acrylate resin, an urethane acrylate resin by a spin coating process, a printing process, a CVD process, etc.

Figure 17:
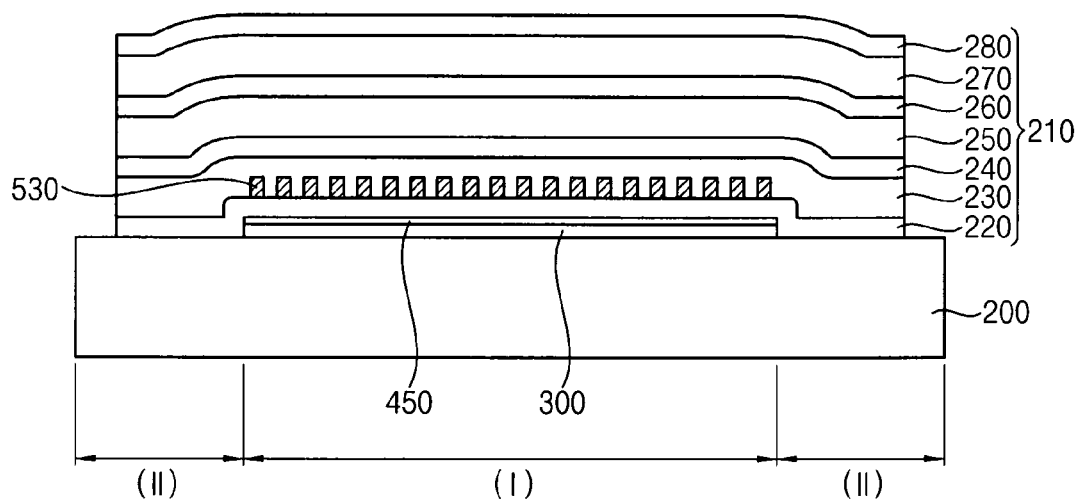

Referring to FIG. 17, second to fourth inorganic material layers 240, 260 and 280 and second and third organic material layers 250 and 270 may be alternately and repeatedly stacked on the first organic material layer 230.

Processes for forming the second to fourth inorganic material layers 240, 260 and 280 may be substantially similar to that described with reference to FIG. 9, and processes for forming the second and third organic material layers 250 and 270 may be substantially similar to that described with reference to FIG. 16.

Figure 18:
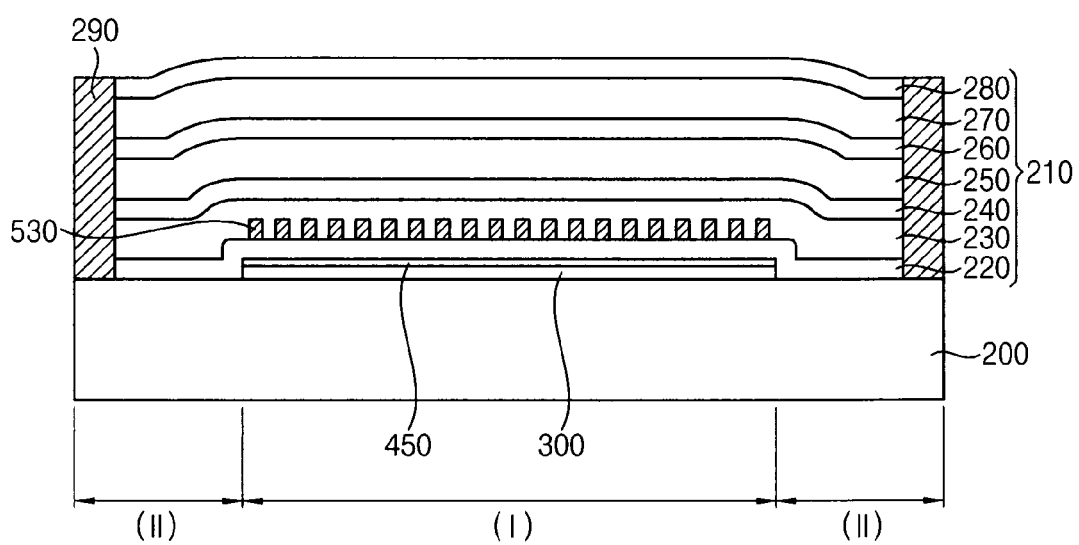

Referring to FIG. 18, a blocking pattern 290 may be formed on the substrate 200. In example embodiments, the blocking pattern 290 may be formed by forming a blocking layer using an epoxy resin, an acrylate resin, an urethane acrylate resin, a polyimide resin, etc., and then patterning the blocking layer.

By performing aforementioned processes, the organic light emitting display device may be completed.

Although, the method of manufacturing the organic light emitting display device may be described to form the organic light emitting display device illustrated in FIG. 4, however, the invention may not be limited to the illustration. For example, the method may be used to manufacture the organic light emitting display device illustrated in FIG. 6 or FIG. 7.

The present inventive concept may be applied to an electric device having a display device. For example, the present inventive concept may be applied to a monitor, a laptop, a PDA, a cellular phone, a smart phone, a smart pad, etc. The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An encapsulation member comprising:
   at least two organic material layers;
   at least two inorganic material layers, the inorganic material layers and the organic material layers being stacked alternately; and
   a light absorption layer pattern formed between one of the organic material layers and one of the inorganic material layers which immediately neighbor each other, the light absorption layer pattern comprising a plurality of wires extending in a first direction and being arranged substantially parallel to each other.

2. The encapsulation member of claim 1, wherein the light absorption layer pattern includes a polymer material and a light absorption material embedded in the polymer material.

3. The encapsulation member of claim 2, wherein the polymer material includes at least one selected from the group consisting of polyisoprene, polyacrylic acid, polybutadiene, polystyrene and polymethyl methacrylate.

4. The encapsulation member of claim 2, wherein the light absorption material includes a light absorption dye.

5. The encapsulation member of claim 1, wherein the inorganic material layers include a first inorganic material layer, a second inorganic material layer and a third inorganic material layer,
   and wherein the organic material layers include a first organic material layer between the first inorganic material layer and the second inorganic material layer, and a second organic material layer between the second inorganic material layer and the third inorganic material layer.

6. The encapsulation member of claim 5, wherein the light absorption layer pattern is disposed between the first inorganic material layer and the first organic material layer, or between the second inorganic material layer and the second organic material layer.

7. The encapsulation member of claim 5, further comprising another light absorption layer pattern, wherein the light absorption layer pattern is disposed between the first inorganic material layer and the first organic material layer, and wherein the other light absorption layer pattern is disposed between the second inorganic material layer and the second organic material layer.

8. The encapsulation member of claim 5, wherein the organic material layers further include a third organic material layer disposed on the third inorganic material layer, and wherein the inorganic material layers further include a fourth inorganic material layer disposed on the third organic material layer.

9. An organic light emitting display device comprising:
   a substrate;
   a display structure disposed over the substrate; and
   the encapsulation member of claim 1 disposed over the substrate to encapsulate the display structure.

10. The organic light emitting display device of claim 9, wherein the light absorption layer pattern includes a polymer material and a light absorption material embedded in the polymer material.

11. The organic light emitting display device of claim 9, wherein the inorganic material layers include a first inorganic material layer, a second inorganic material layer, a third inorganic material layer and a fourth inorganic material layer,
   and wherein the organic material layers include a first organic material layer between the first inorganic material layer and the second inorganic material layer, a second organic material layer between the second inorganic material layer and the third inorganic material layer, and a third organic material layer between the third inorganic material layer and the fourth inorganic material layer.

12. The organic light emitting display device of claim 11, wherein the light absorption layer pattern is disposed between the first inorganic material layer and the first organic material layer, between the second inorganic material layer and the second organic material layer, or between the third inorganic material layer and the third organic material layer.

13. The organic light emitting display device of claim 9, further comprising a blocking wall formed over the substrate, wherein the blocking wall contacts boundary portions of the organic material layers and the inorganic material layers.

14. The organic light emitting display device of claim 9, further comprising a retardation layer between the display structure and the light absorption layer pattern.

15. A method of manufacturing an organic light emitting display device, comprising:
- providing a substrate and a display structure formed over the substrate; and
- forming the encapsulation member of claim 1 over the substrate to encapsulate the display structure, thereby making an organic light emitting display device comprising the encapsulation member.

16. The method of claim 15, wherein providing an encapsulation member comprises forming the light absorption layer pattern,
- wherein forming the light absorption layer pattern comprises:
- providing a donor structure including a plurality of wires arranged substantially parallel to each other; and
- by using a laser-induced thermal imaging process, transferring the plurality of wires onto the inorganic material layer to form the light absorption layer pattern.

17. The method of claim 16, wherein providing the donor structure comprises:
- forming a light to heat conversion layer on a base substrate;
- forming a block copolymer layer on the light to heat conversion layer;
- annealing the block copolymer layer to form a light absorption layer pattern and dummy portions; and
- removing the dummy portions.

18. The method of claim 17, wherein the block copolymer layer includes at least two selected from the group consisting of polyisoprene, polyacrylic acid, polybutadiene, polystyrene and polymethyl methacrylate.

* * * * *